(12) United States Patent
Tazima et al.

(10) Patent No.: US 7,893,450 B2
(45) Date of Patent: Feb. 22, 2011

(54) SEMICONDUCTOR LIGHT-EMITTING ELEMENT AND SEMICONDUCTOR LIGHT-EMITTING ELEMENT MANUFACTURING METHOD

(75) Inventors: Mikio Tazima, Niiza (JP); Yoshiki Tada, Niiza (JP); Tetsuji Matsuo, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 82 days.

(21) Appl. No.: 12/169,988

(22) Filed: Jul. 9, 2008

(65) Prior Publication Data

US 2009/0026476 A1    Jan. 29, 2009

(30) Foreign Application Priority Data

Jul. 26, 2007  (JP) .............................. 2007-194905

(51) Int. Cl.
*H01L 33/00* (2010.01)

(52) U.S. Cl. .............................. 257/98; 257/13; 257/22; 257/79; 257/184; 257/431; 257/432; 438/22; 438/25; 438/26; 438/27; 438/29

(58) Field of Classification Search ................... 257/13, 257/22, 79, 98, 184, 431, 432; 438/31, 22, 438/25, 26, 27, 29
See application file for complete search history.

(56) References Cited

U.S. PATENT DOCUMENTS

| 6,091,085 A * | 7/2000 | Lester | .......................... 257/98 |
| 2008/0111141 A1* | 5/2008 | Li et al. | ......................... 257/88 |

FOREIGN PATENT DOCUMENTS

| JP | 7-169994 | 7/1995 |
| JP | 11-74559 | 3/1999 |
| JP | 2003-318443 | 11/2003 |

* cited by examiner

*Primary Examiner*—A. Sefer
*Assistant Examiner*—Farid Khan
(74) *Attorney, Agent, or Firm*—Oblon, Spivak, McClelland, Maier & Neustadt, L.L.P.

(57) ABSTRACT

An aspect of the present invention inheres in a semiconductor light-emitting element includes a light-emitting functional stacked body including a light-emitting region having a light-emitting function, and including a light extraction surface for extracting light emitted from the light-emitting region, and an upward convex lens disposed on the light extraction surface.

1 Claim, 10 Drawing Sheets

SEMICONDUCTOR LIGHT-EMITTING ELEMENT AND SEMICONDUCTOR LIGHT-EMITTING ELEMENT MANUFACTURING METHOD

CROSS REFERENCE TO RELATED APPLICATIONS

This application is based upon and claims the benefit of priority from the prior Japanese Patent Application No. P2007-194905, filed on Jul. 26, 2007; the entire contents of which are incorporated herein by reference.

BACKGROUND OF THE INVENTION

1. Field of the Invention

The present invention relates to a semiconductor light-emitting element, and particularly to a semiconductor light-emitting element of which light extraction efficiency is enhanced and to a manufacturing method of the semiconductor light-emitting element.

2. Description of the Related Art

In a semiconductor light-emitting element composed of semiconductor materials, a refractive index of an inside of the semiconductor light-emitting element is higher than a refractive index of the air to which light is finally emitted. Therefore, the light generated in a pn junction in the inside of the semiconductor light-emitting element is reflected owing to a refractive index difference on an interface between the air and the semiconductor materials, and the light cannot be sufficiently extracted to an outside of the semiconductor light-emitting element.

As a countermeasure against this problem, it has been proposed to stack a transparent material having a refractive index that is intermediate between the refractive index of the semiconductor materials and refractive indices of sealing resin and the air on a light extraction surface of the semiconductor light-emitting element. Moreover, it has been proposed to increase light extraction area/solid angle by performing a process such as surface roughening for the light extraction surface, and such a proposal has been put into practical use.

However, even by means of these methods, efficient extraction and maximum use of the light generated in the inside of the semiconductor light-emitting element have not been achieved yet.

SUMMARY OF THE INVENTION

An aspect of the present invention inheres in a semiconductor light-emitting element includes a light-emitting functional stacked body including a light-emitting region having a light-emitting function, and including a light extraction surface for extracting light emitted from the light-emitting region, and an upward convex lens disposed on the light extraction surface.

Another aspect of the invention inheres in a semiconductor light-emitting element manufacturing method includes growing a light-emitting functional stacked body on one of main surfaces of a growth substrate, forming a groove portion penetrating through the light-emitting functional stacked body, and performing isotropic etching for the growth substrate from a region of the one of the main surfaces of the growth substrate, the region having been exposed by the groove portion that has penetrated through the light-emitting functional stacked body, thereby forming a cavity in the growth substrate, pouring into the cavity a material lower in refractive index than a material composing the light-emitting functional stacked body, thereby forming a lens that is convex toward the growth substrate, and removing the growth substrate, thereby exposing a light extraction surface of the light-emitting functional stacked body and the lens.

DETAILED DESCRIPTION OF EXEMPLARY EMBODIMENTS OF THE INVENTION

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set fourth such as specific signal values, etc. to provide a thorough understanding of the present invention. However, it will be obvious to those skilled in the art that the present invention may be practiced without such specific details.

First Embodiment

Figure 1:
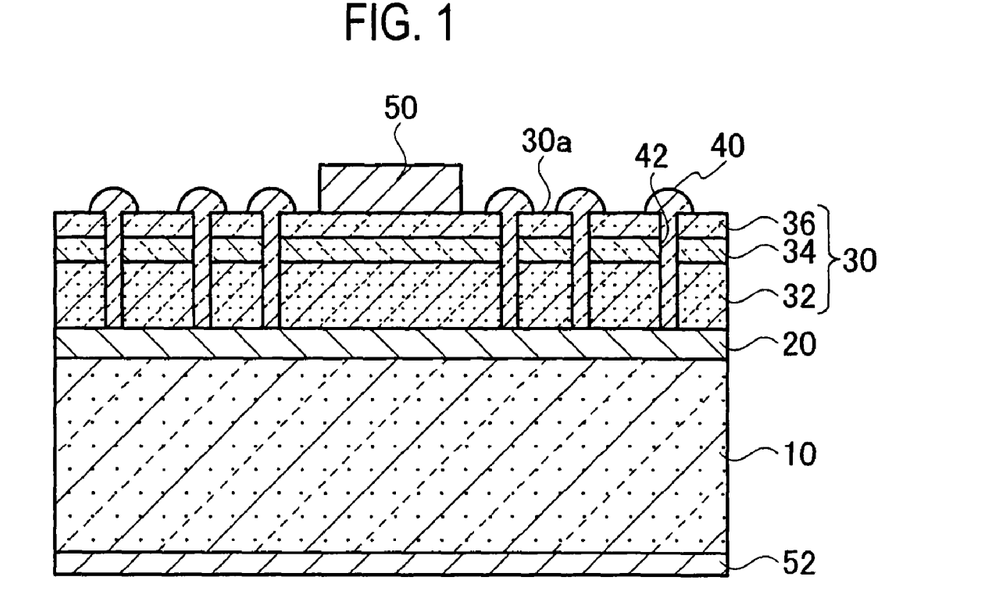
FIG. 1 is a schematic cross-sectional view of a semiconductor light-emitting element according to a first embodiment of the present invention.

As shown in FIG. 1, a semiconductor light-emitting element according to a first embodiment of the present invention includes: a light-emitting functional stacked body 30 having a light-emitting region 34 with a light-emitting function, and having groove portions 42 formed from a light extraction surface 30a to positions deeper than the light-emitting region 34; and upward convex lenses 40 arranged on the light extraction surface 30a so as to cover the groove portions 42. The semiconductor light-emitting element according to the first embodiment further includes: a support substrate 10 that supports the light-emitting functional stacked body 30; a reflection film 20 formed on the support substrate 10; a first electrode 50 connected to the light-emitting functional stacked body 30; and a second electrode 52 connected to the support substrate 10.

The support substrate 10 has a function as a substrate for epitaxially growing the light-emitting functional stacked body 30, and a function as a current passage between the first electrode 50 and the second electrode 52. The support substrate 10 is formed at a thickness of approximately 200 μm to 500 μm, and is added with impurities which decide a conduction type. The support substrate 10 is formed of silicon (Si), gallium arsenide (GaAs), and a nitride compound semiconductor such as gallium nitride (GaN).

The light-emitting functional stacked body 30 has the light-emitting function, and for example, can be formed into a double-hetero structure in which a first semiconductor layer 32, the light-emitting region (active layer) 34 and a second semiconductor layer 36 are stacked on one another. Here, the first semiconductor layer 32 is formed of $Al_X In_Y Ga_{1-X-Y} N$ (where $0 \leq X < 1$, $0 \leq Y < 1$) added with magnesium (Mg) as a p-type dopant, and for example, is a P-type cladding layer formed of GaN. The active layer 34 is formed of $Al_X In_Y Ga_{1-X-Y} N$ (where $0 \leq X < 1$, $0 \leq Y < 1$), and for example, is indium gallium nitride (InGaN). The second semiconductor layer 36 is formed of $Al_X In_Y Ga_{1-X-Y} N$ (where $0 \leq X < 1$, $0 \leq Y < 1$) added with Si as an n-type dopant, and for example, is an N-type cladding layer formed of GaN. In the case of the double-hetero structure as shown in FIG. 1, the active layer 34 becomes the light-emitting region. Note that, though the active layer 34 is illustrated as one layer in FIG. 1, there can be adopted: a multi quantum well structure with a configuration in which barrier layers formed of $In_X Ga_{1-X} N$ and well layers formed of GaN are alternately arranged repeatedly plural times; a single quantum well structure with a configuration in which a barrier layer formed of $In_X Ga_{1-X} N$ is sandwiched by a pair of well layers formed of GaN; and the like. Moreover, the light-emitting functional stacked body 30 can omit the active layer 34. In the case of omitting the active layer 34, a vicinity of an interface between the first semiconductor layer 32 and the second semiconductor layer 36, where electrons and holes are recombined with each other, becomes the light-emitting region.

The first electrode 50 functions as an anode electrode and a bonding pad electrode, and is brought into low resistance (ohmic) contact with the light-emitting functional stacked body 30. The first electrode 50 is an electrode formed by annealing gold (Au) or by stacking nickel (Ni) and Au on each other by vapor deposition and the like and annealing an obtained film thus obtained. The first electrode 50 has a thickness enough not to allow the light generated in the light-emitting region such as the active layer 34 to transmit therethrough. Hence, a portion of the light extraction surface 30a, which is not covered with the first electrode 50, is a portion effective for extracting the light, which is emitted from the light-emitting region, to the outside of the semiconductor light-emitting element. For example, as shown in FIG. 1, in the case where the first electrode 50 is disposed on a substantial center of the light extraction surface 30a of the light-emitting functional stacked body 30, a periphery of the first electrode 50 becomes the portion effective for extracting the light.

The second electrode 52 is brought into low resistance (ohmic) contact with a surface of the support substrate 10, which is opposite with a surface where the light-emitting functional stacked body 30 is provided. The second electrode 52 is an electrode formed by annealing Au or by stacking Ni and Au on each other by the vapor deposition and the like and annealing an obtained film thus obtained.

The reflection film 20 is provided for suppressing the light, which is generated from the light-emitting region (active layer) 34 on the support substrate 10, from being absorbed to the support substrate 10. As the reflection film 20, it is possible to employ an Ag alloy, a Ni alloy, indium tin oxide (ITO), and the like. Note that, as will be shown by a manufacturing method to be described later, in the case of forming the semiconductor light-emitting element according to the first embodiment by using a lamination technique, a laminated metal layer formed by bonding metal layers of Au, an Au alloy, Al, the Ag alloy, rhodium (Rh), platinum (Pt) and the like to each other by a solder, a conductive adhesive, and the like is formed between the reflection film 20 and the support substrate 10.

The lenses 40 are arranged on such a region of the light extraction surface 30a of the light-emitting functional stacked body 30, on which the first electrode 50 is not formed. For the lenses 40, a material can be used, in which a refractive index is lower than that of the semiconductor material of the nitride compound semiconductor or the like composing the light-emitting functional stacked body 30, and is higher than that of the outside of the semiconductor light-emitting element, to which the light is finally emitted. For the lenses 40, for example, there can be used dielectrics (refractive index: 1.1 to 2.4) of epoxy resin, silicon resin, aluminum oxide ($AlO_X$), iron oxide ($Fe_2O_3$), silicon nitride ($SiN_X$), cobalt oxide ($CoO_X$), zirconium oxide ($ZrO_X$), copper oxide ($CuO_X$), titanium oxide ($TiO_2$), zinc oxide ($ZnO_X$), indium oxide ($In_2O_5$), tin oxide ($SnO_2$), hafnium oxide ($HfO_2$), and the like. Moreover, it is preferable that the lenses 40 have a shape of being convex in a light-emitting direction (upper direction), like a dome-like semispherical shape or a pyramid-like shape. In the case of the lenses 40 having the semispherical or pyramid-like shape, a diameter of a bottom surface of each of the lenses 40 is set at 0.4 to 200 μm when the semiconductor light-emitting element is viewed from the light extraction surface 30a side.

When the semiconductor light-emitting element is viewed from the light extraction surface 30a side, the groove portions 42 are formed so as to be included in the lenses 40, and are formed directly under the lenses 40 from the light extraction surface 30a of the light-emitting functional stacked body 30 toward a surface thereof opposite with the light extraction surface 30a. In the case of viewing the groove portions 42 from the light extraction surface 30a of the semiconductor light-emitting element, the groove portions 42 are formed into a dot shape or a line (groove) shape. In a similar way, the lenses 40 located on the groove portions 42 are also formed into a dot shape or a line shape. A diameter or width of each of the groove portions 42 is smaller than that of the bottom surface of each lens 40, and for example, is 0.2 μm to 100 μm. Into the groove portions 42, as shown in FIG. 1, dielectrics similar to the dielectrics for use in the lenses 40 are embedded, and accordingly, the lenses 40 are partially embedded thereinto. In FIG. 1, an example is shown, where the groove portions 42 penetrate from the light extraction surface 30a of the light-emitting functional stacked body 30 to the surface thereof opposite with the light extraction surface 30a; however, the groove portions 42 do not have to penetrate through the light-emitting functional stacked body 30. However, it is desirable that bottom surfaces of the groove portions 42 be formed more deeply than the light-emitting region such as the active layer 34, and it is more desirable that the bottom surfaces of the groove portions 42 penetrate through the light-emitting functional stacked body 30.

A description will be made below of functions of the semiconductor light-emitting element according to the first embodiment, and of travel of the light generated in the semiconductor light-emitting element.

With regard to the following refractive indices in an inside of the semiconductor light-emitting element according to the first embodiment, a refractive index of $In_xGa_{1-x}N$ composing the barrier layer is approximately 3.0, and refractive indices of $Al_xGa_{1-x}N$ and GaN, which compose the first semiconductor layer 32 and the second semiconductor layer 36, are approximately 2.4 to 2.5. Specifically, the refractive index of $In_xGa_{1-x}N$ composing the barrier layer is higher, and accordingly, the light generated from the active layer 34 causes total reflection on the first semiconductor layer 32 and the second semiconductor layer 36, and light traveling sideward with respect to the light extraction surface 30a is relatively increased, and accordingly, the light concerned cannot be ignored.

A refractive index of the nitride compound semiconductor composing the light-emitting functional stacked body 30 is 2.4 to 2.5, which is higher than that of the dielectrics embedded into the groove portions 42. Hence, as shown in a left part of FIG. 2, with regard to light having a predetermined incident angle or more on an interface between the light-emitting functional stacked body 30 and each of the groove portions 42, a part of the light concerned is reflected, travels in a direction of the light extraction surface 30a, and reaches the convex lens 40 provided on the light-emitting functional stacked body 30. With regard to the light emitted by the light-emitting functional stacked body 30, the light thereof totally reflected on an interface between the light extraction surface 30a and the outside is suppressed by each lens 40 than in the case where each lens 40 is not provided. Here, the lens 40 is composed of the dielectric, in which the refractive index is lower that of the nitride compound semiconductor composing the light-emitting functional stacked body 30, and is higher than that of the outside. Then, the light emitted as described above is condensed by the lens 40, and is extracted to the outside of the semiconductor light-emitting element. Moreover, it is preferable that each lens 40 have the shape of being convex upward in order that the light traveling upward or sideward in the lens 40 can be suppressed from being totally reflected on an interface between the lens 40 and the outside of the semiconductor light-emitting element.

Figure 2:
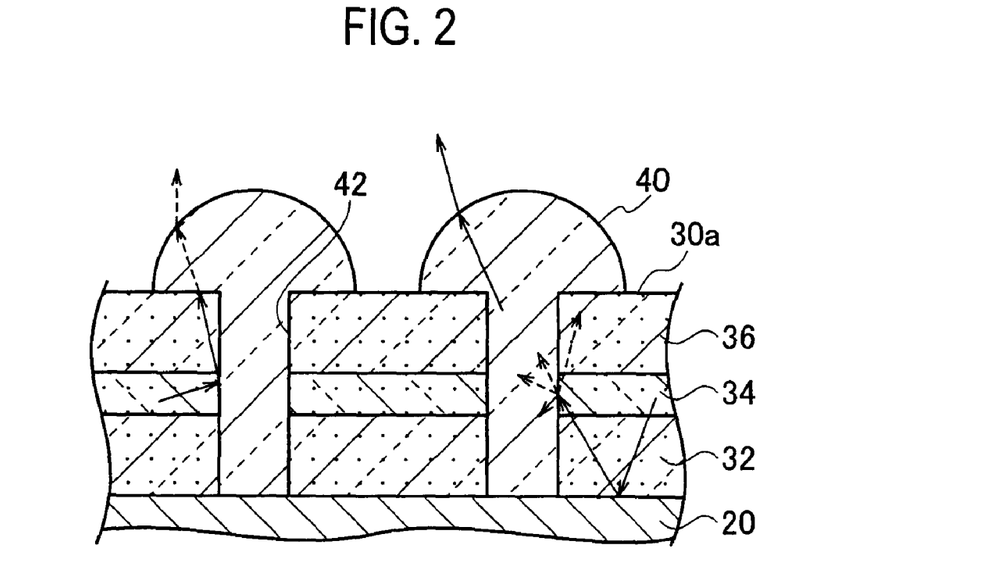
FIG. 2 is a view showing motions of light generated in the semiconductor light-emitting element according to the first embodiment of the present invention.

Moreover, when the light traveling sideward in the inside of the semiconductor light-emitting element according to the first embodiment reaches each of the groove portions 42, as shown in a right part of FIG. 2, a part of the light travels to the inside of the groove portion 42 without being reflected. Then, the light is reflected diffusely by the dielectric embedded into the groove portion 42. A part of the light reflected diffusely travels in the direction of the light extraction surface 30a, and another part thereof reaches the lens 40 or the light extraction surface 30a while being deflected or reflected on a side surface of the groove portion 42 or while repeating such deflection and reflection. The light that has reached an upper surface of the lens 40 suppresses the light thereof totally reflected on the interface between the outside of the semiconductor light-emitting element and the lens 40, is condensed by the lens 40, and is extracted to the outside of the semiconductor light-emitting element. Therefore, it is preferable that the lens 40 have such a structure of being convex upward in order that the light traveling in the direction of the light extraction surface 30a can be suppressed from being totally reflected on the interface between the lens 40 and the outside of the semiconductor light-emitting element. Hence, in accordance with the semiconductor light-emitting element according to the first embodiment of the present invention, extraction efficiency of the light from the light extraction surface 30a can be enhanced.

In accordance with the semiconductor light-emitting element according to the first embodiment of the present invention, the lenses 40 with the convex shape are formed of the dielectrics, whereby a reflection component of the light radiated from the light-emitting functional stacked body 30 is reduced, and an electric power-saving/long-lifetime semiconductor light-emitting element in which external light emission efficiency is enhanced can be obtained.

Moreover, in accordance with the semiconductor light-emitting element according to the first embodiment of the present invention, the epoxy resin and the silicon resin are used as the materials of the dielectrics of the lenses 40, thus making it possible to adopt a hollow metal package without decreasing the light emission efficiency, whereby it is made possible to reduce a stress to the resins and to enhance environmental resistance of the semiconductor light-emitting element itself.

A description will be made below of the manufacturing method of the semiconductor light-emitting element according to the first embodiment of the present invention, which uses the lamination technique, while referring to FIGS. 3A to 4C.

Figure 3A:
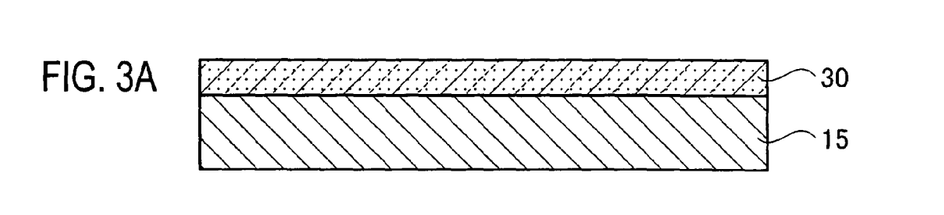
FIGS. 3A to 3F are process cross-sectional views of a semiconductor light-emitting element manufacturing method according to the first embodiment of the present invention (No. 1).

(A) First, as shown in FIG. 3A, a growth substrate 15 of Si, GaAs, GaP or the like is prepared, and the light-emitting functional stacked body 30 of AlInGaN, AlInGaP or the like, which includes the pn junction, is grown on one of main surfaces of the growth substrate 15 by metalorganic vapor phase epitaxy (MOVPE) or molecular beam epitaxy (MBE).

Figure 3B:
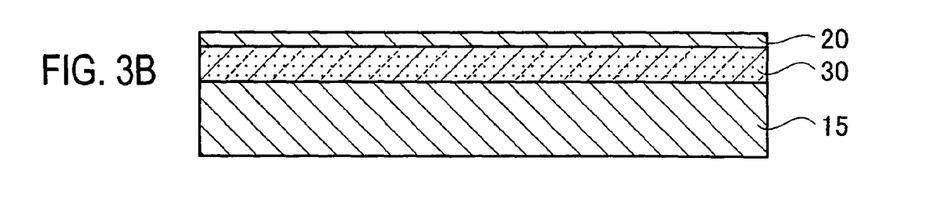

(B) Next, as shown in FIG. 3B, the reflection film 20 is formed on the light-emitting functional stacked body 30. The reflection film 20 is formed of the Ag alloy, the Ni alloy, the ITO or the like. Moreover, the reflection film 20 can be one in which the laminated metal layer formed of Au, the Au alloy, the conductive adhesive such as the solder, Al, the Ag alloy and the like is allowed to also serve as a contact layer, or can be one on which the laminated metal layer is stacked. The reflection film 20 is annealed according to needs.

Figure 3C:
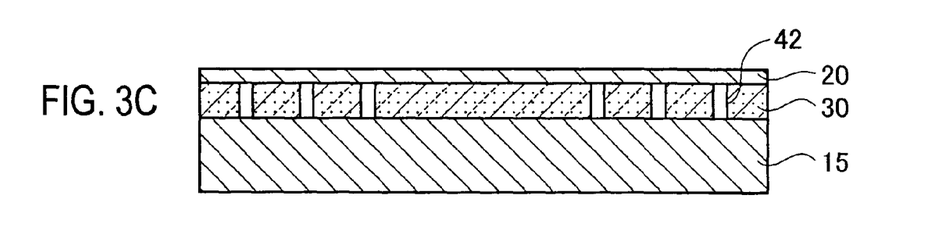

(C) Next, as shown in FIG. 3C, an etching mask (not shown) of a resist film, a $SiO_2$ film, a Ni film or the like is formed on the light-emitting functional stacked body 30 and the reflection film 20 so as to cover portions thereof other than the portions where the groove portions 42 are to be formed. Then, the groove portions 42 with a diameter of 0.2 μm to 100 μm, which are holes penetrating through the light-emitting functional stacked body 30 and the reflection film 20, are formed by reactive ion etching (RIE) and the like. The groove portions 42 may be line (groove)-like grooves with a width of 0.2 μm to 100 μm.

Figure 3D:
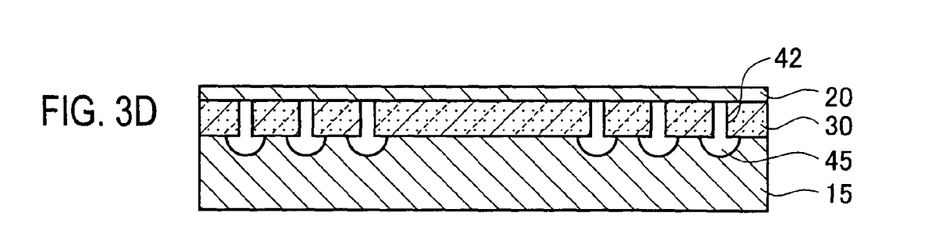

(D) Next, after the etching mask is removed, as shown in FIG. 3D, wet etching (isotropic etching) is performed for the growth substrate 15 by using a strong acid or a strong alkali, such as fluoronitric acid, KOH, sulfuric acid and phosphoric acid while using the light-emitting functional stacked body 30 and the reflection film 20 as masks. In such a way, semi-spherical cavities 45 with a diameter of 0.4 μm to 200 μm are formed in the growth substrate 15 while taking, as centers, regions of the growth substrate 15, which are exposed by the groove portions 42 having penetrated therethrough. In the case of using the strong alkali in the wet etching, pyramid-like cavities 45 can be formed in the growth substrate 15 while taking the regions of the growth substrate 15, which are exposed by the groove portions 42 having penetrated therethrough, as centers of bottom surfaces of the cavities 45 concerned. According to needs, it is also possible to protect the light-emitting functional stacked body 30 and the reflection film 20 at the time of the wet etching by using a similar mask to that in the case of forming the groove portions 42 penetrating through the light-emitting functional stacked body 30.

Figure 3E:
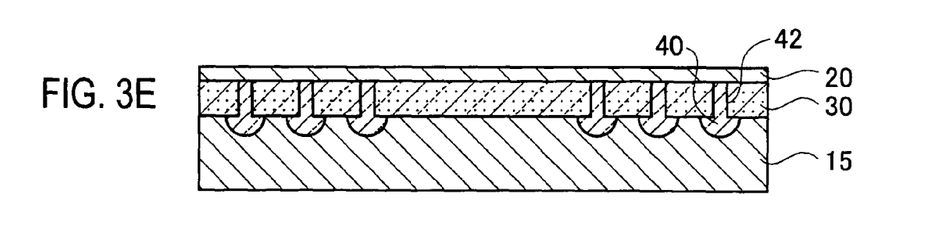

(E) Next, as shown in FIG. 3E, a dielectric material is supplied and poured onto the entireties of upper portions of the light-emitting functional stacked body 30 and the reflection film 20 and into the groove portions 42 and the cavities 45 formed in the growth substrate 15 by a spin coating method or a dipping method. Here, the dielectric material is such as epoxy, silicon, AlO, SiN, $Fa_2O_3$, CoO, ZrO, CuO, $TiO_2$, ZnO, $In_2O_5$, $SnO_2$ and $HfO_2$, which is a material having a lower refractive index than the semiconductor material such as the nitride semiconductor composing the light-emitting functional stacked body 30. Thereafter, the supplied dielectric material is sintered, whereby the lenses 40 as sintered bodies are formed. Subsequently, the dielectric material remaining on the light-emitting functional stacked body 30 and the reflection film 20 is removed by polishing, lapping, etching, and so on.

Figure 3F:
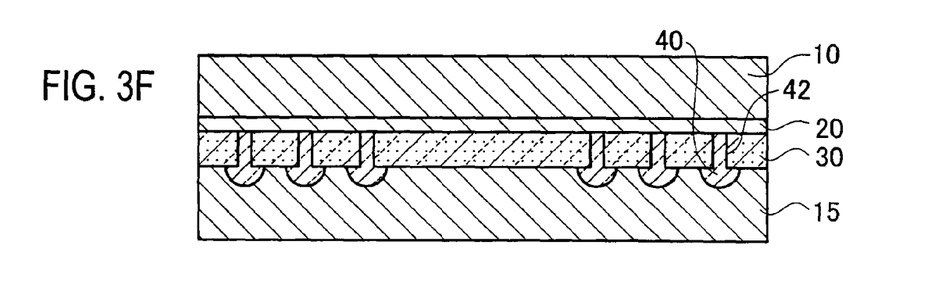

(F) Next, as shown in FIG. 3F, by wafer bonding using the solder, the conductive adhesive or the like, the support substrate 10 is laminated not on the growth substrate 15 but on the reflection film 20. According to needs, metal layers are formed of Au, Al, the Ag alloy or the like individually on the light-emitting functional stacked body 30 and the support substrate 10, and the metal layers are laminated to each other, whereby the wafer bonding can be facilitated.

Figure 4A:
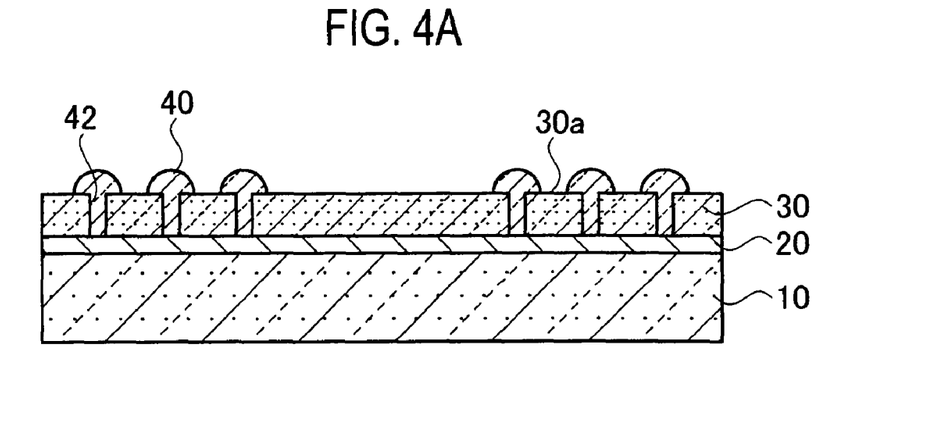
FIGS. 4A to 4C are process cross-sectional views of the semiconductor light-emitting element manufacturing method according to the first embodiment of the present invention (No. 2).

(G) Next, as shown in FIG. 4A, the growth substrate 15 is removed by performing the wet etching therefor by using the acid or the strong alkali, such as the fluoronitric acid, KOH, the sulfuric acid and the phosphoric acid, whereby the light extraction surface 30a of the light-emitting functional stacked body 30 and the lenses 40 are exposed.

Figure 4B:
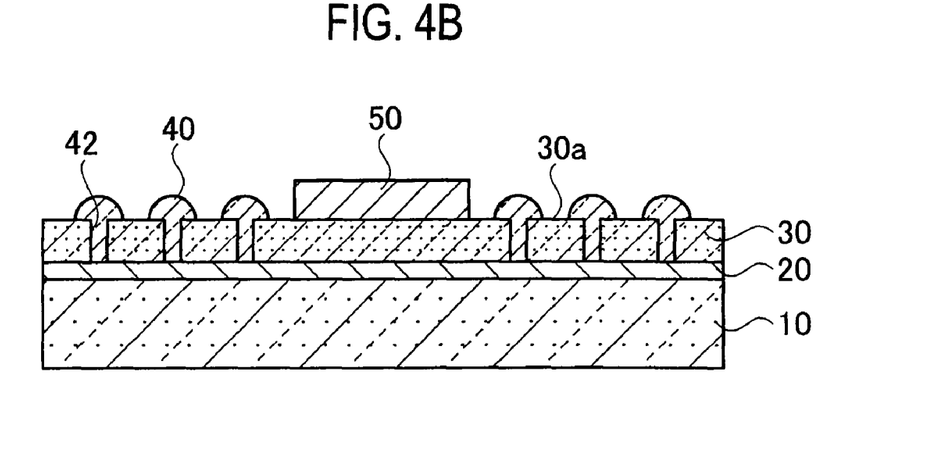

(H) Next, as shown in FIG. 4B, the first electrode 50 of ITO, ZnO, Ti/Al, Cr/Al or the like is disposed on the light extraction surface 30a of the light-emitting functional stacked body 30. Note that a contact layer (not shown) may be provided between the light-emitting functional stacked body 30 and the first electrode 50.

Figure 4C:
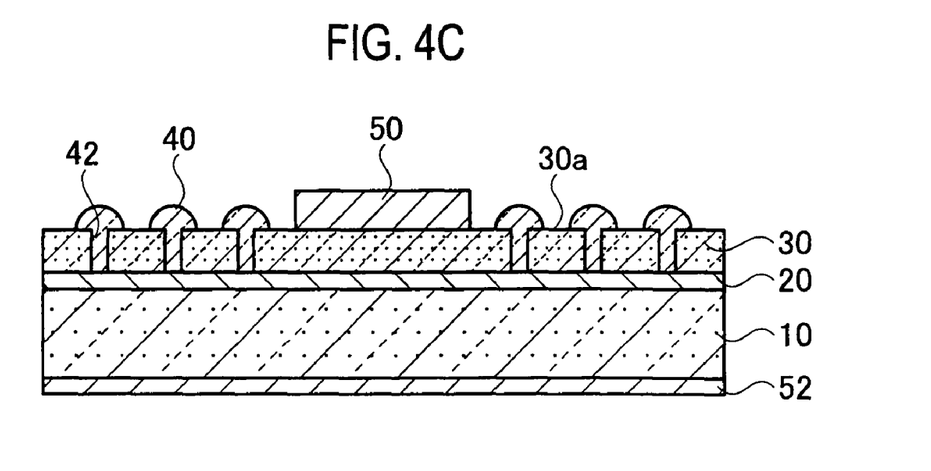

(I) Next, as shown in FIG. 4C, the second electrode 52 of Ti/Ni/Au or the like is disposed so as to be opposite with the first electrode 50. Note that a contact layer (not shown) may be provided between the support substrate 10 and the second electrode 52.

The semiconductor light-emitting element according to the first embodiment is manufactured by the above-described manufacturing method using the lamination technique. The semiconductor light-emitting element is divided into chips by dice scribe. Then, each chip of the semiconductor light-emitting element is bonded to a lead frame, and is sealed by the epoxy resin, the silicon resin or the like, or alternatively, is incorporated into the metal package.

In accordance with the semiconductor light-emitting element manufacturing method according to the first embodiment of the preset invention, the cavities are formed in the growth substrate 15, and the dielectric material is poured into the cavities, thus making it possible to form the semispherical or pyramid-like lenses 40. Accordingly, the manufacturing method concerned is excellent in mass productivity of the semiconductor light-emitting element in which the extraction efficiency of the light from the light extraction surface 30a is enhanced, and thereby can reduce manufacturing cost of the semiconductor light-emitting element.

Second Embodiment

Figure 5:
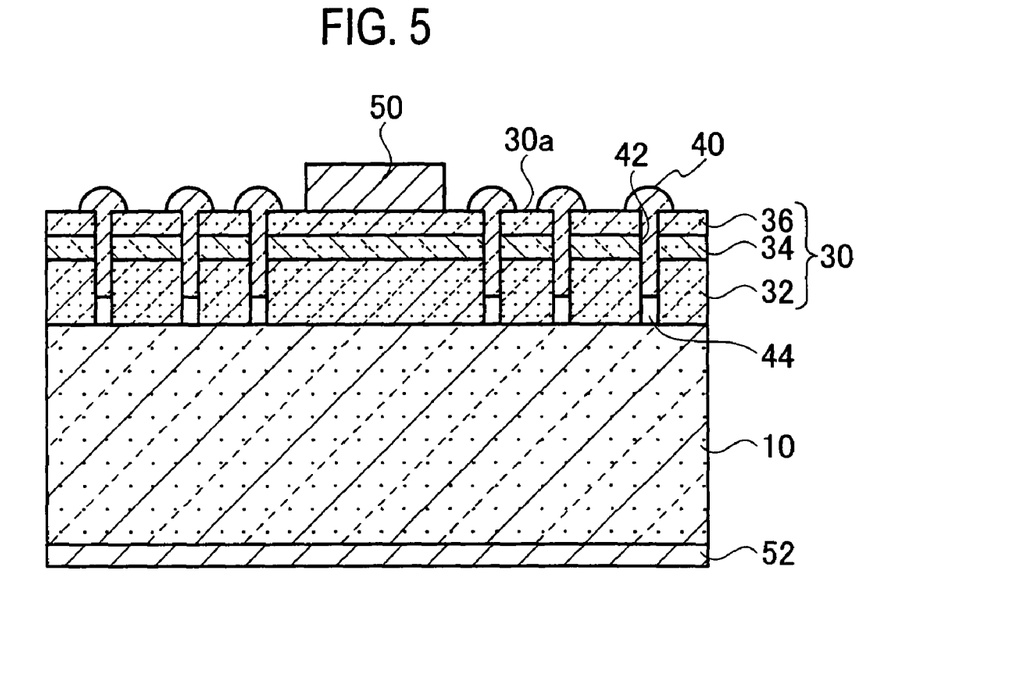
FIG. 5 is a schematic cross-sectional view of a semiconductor light-emitting element according to a second embodiment of the present invention.

As shown in FIG. 5, a semiconductor light-emitting element according to a second embodiment of the present invention is different from the semiconductor light-emitting element shown in FIG. 1 in that the reflection film 20 is not present, and that cavity portions 44 are provided since the insides of the groove portions 42 are not entirely filled with similar dielectrics to the dielectrics for use in the lenses 40. Others are substantially similar to those of the semiconductor light-emitting element described in the first embodiment, and accordingly, a duplicate description will be omitted.

The light incident onto each of the cavity portions 44 is reflected on a side wall surface of the groove portion 42 and on the surface of the support substrate 10, travels in the direction of the light extraction surface 30a, and reaches the convex lens 40 provided on the light-emitting functional stacked body 30. The light that has reached the lens 40 suppresses the light thereof totally reflected on the interface between the outside of the semiconductor light-emitting element and the lens 40, is condensed by the lens 40, and is extracted to the outside of the semiconductor light-emitting element.

In FIG. 5, an example is shown, where the cavity portion 44 is a part of the groove portion 42; however, the entirety of the groove portion 42 may be the cavity portion 44. Moreover, such a configuration is also possible, in which a dielectric different in refractive index from the dielectric for use in the lens 40 is embedded into a part or all of the cavity portion 44, and the inside of the groove portion 42 is formed into a multilayered dielectric layer.

In accordance with the semiconductor light-emitting element according to the second embodiment of the present invention, even if the cavity portion 44 is present in the inside of each of the groove portions 42, and the dielectric as a material different in refractive index from the dielectric for use in the lens 40 is embedded into a part or all of the cavity portion 44, the extraction efficiency of the light from the light extraction surface 30a is not decreased, and similar light extraction efficiency to that of the semiconductor light-emitting element according to the first embodiment can be obtained.

In the second embodiment, the reflection film 20 is not provided, whereby cost of the material for use in the reflection film 20 can be reduced. Moreover, a manufacturing process for providing the reflection film 20 can also be reduced, and accordingly, a time required for manufacturing the semiconductor light-emitting element can be shortened. Note that it is naturally possible to adopt a structure in which the reflection film 20 is provided between the support substrate 10 and the light-emitting functional stacked body 30.

Third Embodiment

Figure 6:
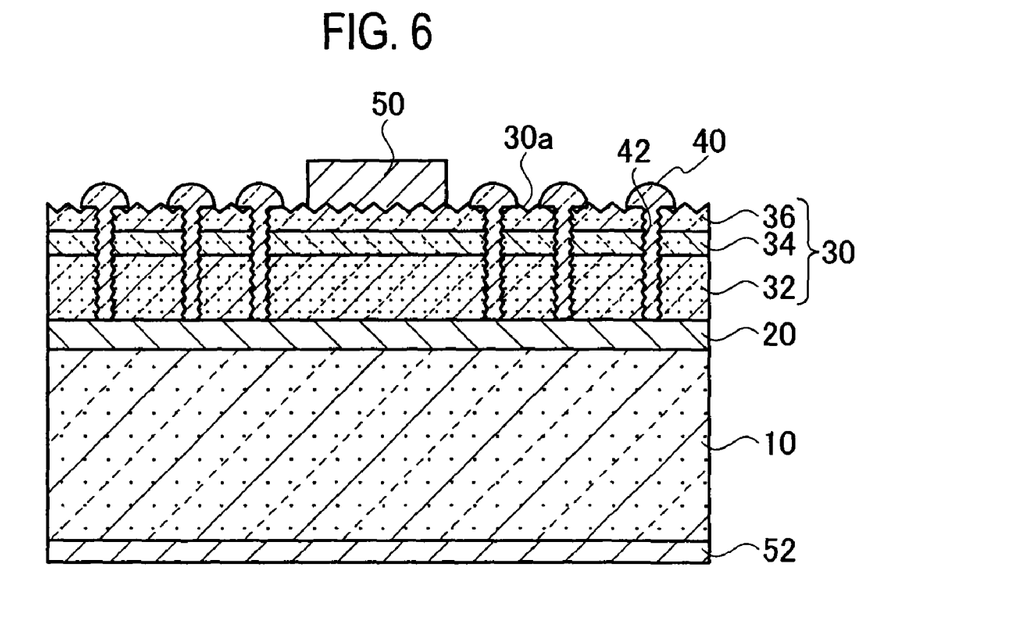
FIG. 6 is a schematic cross-sectional view of a semiconductor light-emitting element according to a third embodiment of the present invention.

As shown in FIG. 6, a semiconductor light-emitting element according to a third embodiment of the present invention is different from the semiconductor light-emitting element shown in FIG. 1 in that plural irregularities are provided on such inner wall surfaces of the groove portions 42 and on the light extraction surface 30a. Others are substantially similar to those of the semiconductor light-emitting element described in the first embodiment, and accordingly, a duplicate description will be omitted.

A height of protrusions of the irregularities and a pitch width therebetween are set at 50 nm to 1 μm, preferably at 100 to 300 nm. The plural irregularities provided on the inner wall surfaces of the groove portions 42 and on the light extraction surface 30a are formed on the surfaces of the nitride semiconductor by performing the wet etching therefor by using, as an etchant, a phosphoric acid ($H_3PO_4$) or potassium hydroxide (KOH) solution, which is warmed up to 70° C.

In the case of providing the plural irregularities on the inner wall surfaces of the groove portions 42, the wet etching is performed after the step of forming the groove portions 42 in the semiconductor light-emitting element manufacturing method described in the first embodiment, whereby the plural irregularities are formed. Moreover, in the case of providing the plural irregularities on the light extraction surface 30a, the wet etching is performed after the step of exposing the light extraction surface 30a in the semiconductor light-emitting element manufacturing method described in the first embodiment, whereby the plural irregularities are formed.

Note that, though it is preferable that the plural irregularities be formed on both of the inner wall surfaces of the groove portions 42 and the light extraction surface 30a, a case is also allowed, where the plural irregularities are formed on at least one of the inner wall surfaces of the groove portions 42 and the light extraction surface 30a. In the case where there is a spot on which the plural irregularities are not desired to be formed, a $SiO_2$ film is formed on a main surface of the spot on which the plural irregularities are not desired to be formed, and thereafter, the nitride semiconductor is etched by the above-described etchant. Then, the main surface covered with the $SiO_2$ film is not etched, and accordingly, the plural irregularities are not formed thereon.

In accordance with the semiconductor light-emitting element according to the third embodiment of the present invention, light extraction area/solid angle thereof can be increased by the plural irregularities formed on the inner wall surfaces of the groove portions 42 and on the light extraction surface 30a. Accordingly, the extraction efficiency of the light from the light extraction surface 30a can be enhanced.

In accordance with the semiconductor light-emitting element according to the third embodiment of the present invention, the lenses 40 with the convex shape are formed of the dielectrics, whereby the reflection component of the light radiated from the light-emitting functional stacked body 30 is reduced, and the electric power-saving/long-lifetime semiconductor light-emitting element in which the external light emission efficiency is enhanced can be obtained.

Moreover, in accordance with the semiconductor light-emitting element according to the third embodiment of the present invention, the epoxy resin and the silicon resin are used as the materials of the dielectrics of the lenses 40, thus making it possible to adopt the hollow metal package without decreasing the light emission efficiency, whereby it is made possible to reduce the stress to the resins and to enhance the environmental resistance of the semiconductor light-emitting element itself.

Other Embodiment

As above, the description has been made of the present invention based on the embodiments. However, it should not be understood that the description and the drawings, which form a part of this disclosure, limit this invention. From this disclosure, a variety of alternative embodiments, examples and operation technologies will be obvious for those skilled in the art.

For example, when the reflection film 20 is not formed in the first to third embodiments, a buffer layer may be formed between the support substrate 10 and the light-emitting functional stacked body 30. The buffer layer mainly has a buffer function for allowing a plane orientation of such a silicon semiconductor substrate to be satisfactorily inherited to a region of the nitride semiconductor formed thereon by the epitaxial growth method. In order to satisfactorily exert this buffer function, it is preferable that the buffer layer have a thickness of 10 nm or more. On the contrary, in order to prevent a crack, it is preferable that the thickness of the buffer layer be restricted to 500 nm or less. The buffer layer is composed of an n-type nitride semiconductor that contains n-type impurities (donor impurities) and is formed of an element of Group 3 and nitrogen, for example, is composed of an n-type nitride semiconductor represented by a chemical formula: $Al_aIn_bGa_{1-a-b}N$ (where $0 \leq a < 1$, $0 \leq b < 1$). When the n-type nitride semiconductor containing the element of Group 3 is epitaxially grown on a p-type silicon semiconductor substrate as the substrate, and such an n-type buffer region is formed, the element of Group 3 in the n-type buffer layer is diffused into the p-type silicon semiconductor substrate, whereby a region into which the element of Groups 3 is diffused is generated. Such a Group 3 element-diffused region is a p-type semiconductor region having lower resistivity than a portion of the p-type silicon semiconductor substrate, in which the Group 3 element-diffused region is not formed.

Moreover, in the first to third embodiments, an optically transparent conductive layer may be formed on an exposed portion of the light extraction surface 30a, on which the lenses 40 are not formed. The optically transparent conductive layer is composed, for example, of a mixture of the indium oxide ($In_2O_3$) and the tin oxide ($SnO_2$), has a function to transmit therethrough the light radiated from the active layer 34, and has conductivity. Hence, the optically transparent conductive layer contributes to an increase of a current through an outer circumferential portion of a main semiconductor region.

Furthermore, in the first to third embodiments, the first semiconductor layer 32 is defined as the p-type cladding layer, and the second semiconductor layer 36 is defined as the n-type cladding layer; however, an arrangement order may be inverted such that the first semiconductor layer 32 is defined as the n-type cladding layer, and that the second semiconductor layer 36 is defined as the p-type cladding layer.

Figure 7A:
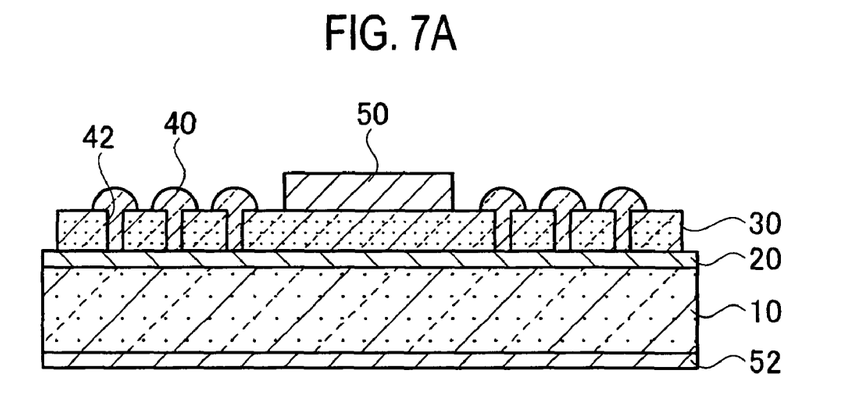
FIGS. 7A and 7B are schematic cross-sectional views of a semiconductor light-emitting element according to another embodiment of the present invention.
Figure 7B:
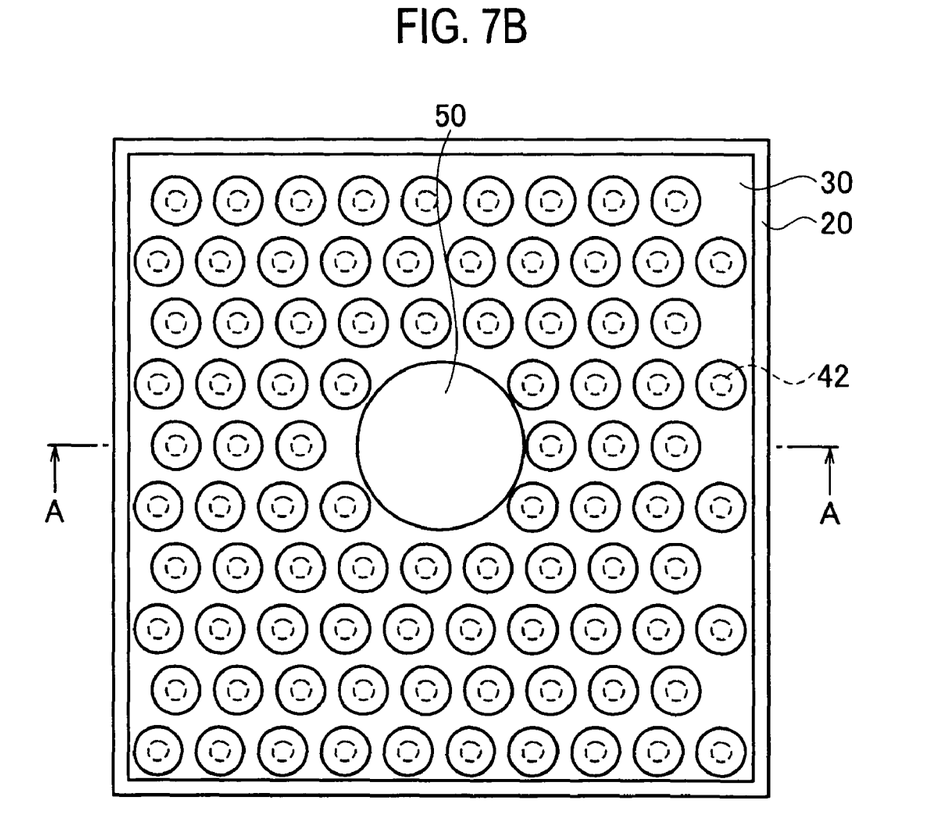
Figure 8A:
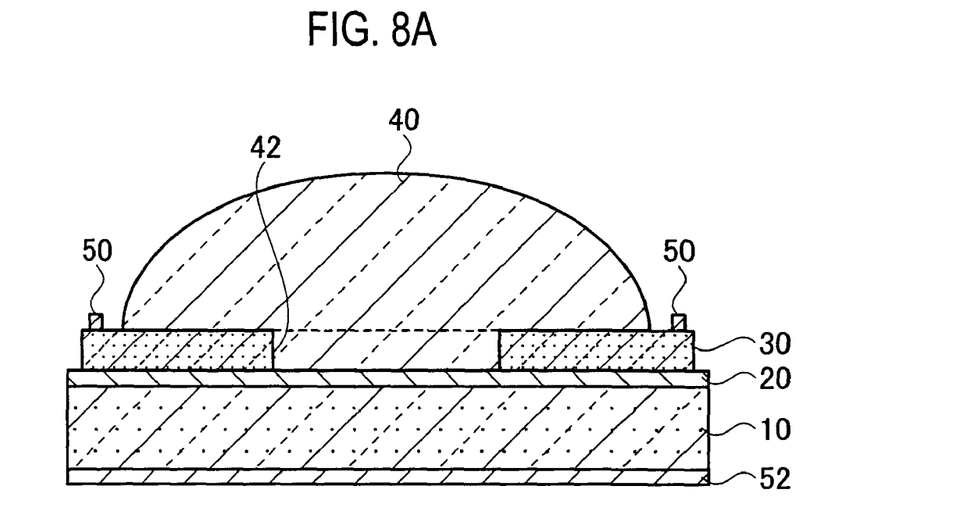
FIGS. 8A and 8B are schematic cross-sectional views of a semiconductor light-emitting element according to another embodiment of the present invention.
Figure 8B:
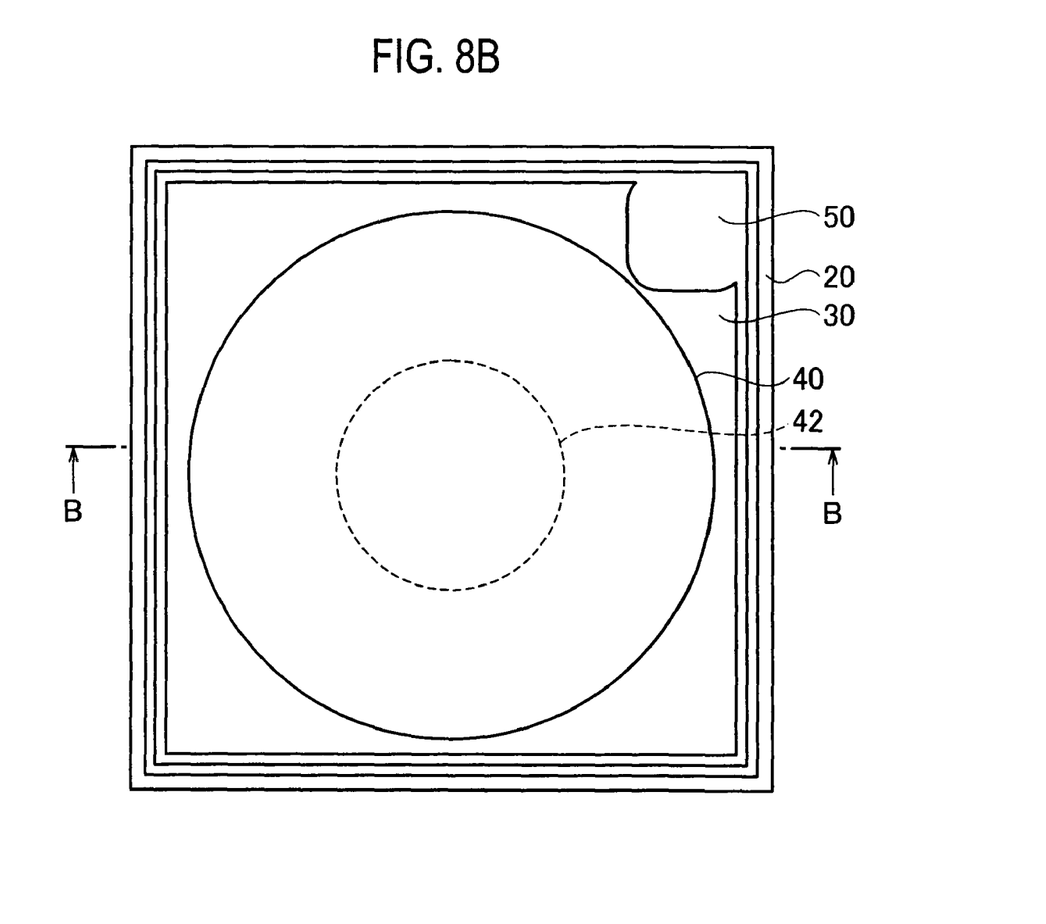
Figure 9A:
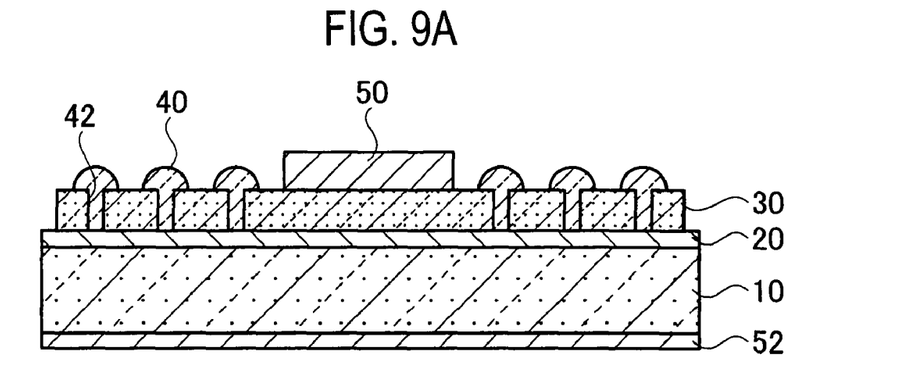
FIGS. 9A and 9B are schematic cross-sectional views of a semiconductor light-emitting element according to another embodiment of the present invention.
Figure 9B:
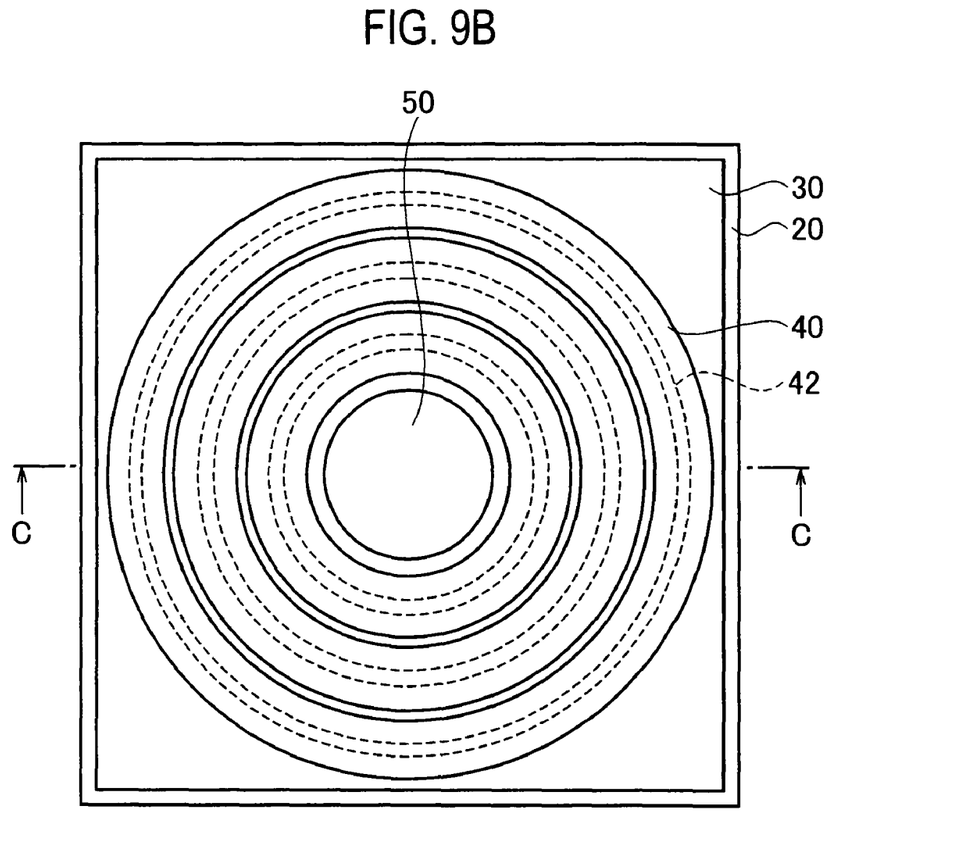
Figure 10A:
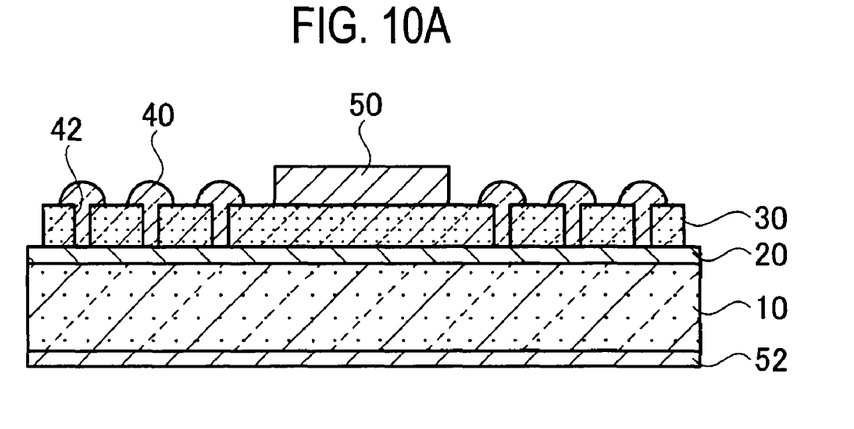
FIGS. 10A and 10B are schematic cross-sectional views of a semiconductor light-emitting element according to another embodiment of the present invention.
Figure 10B:
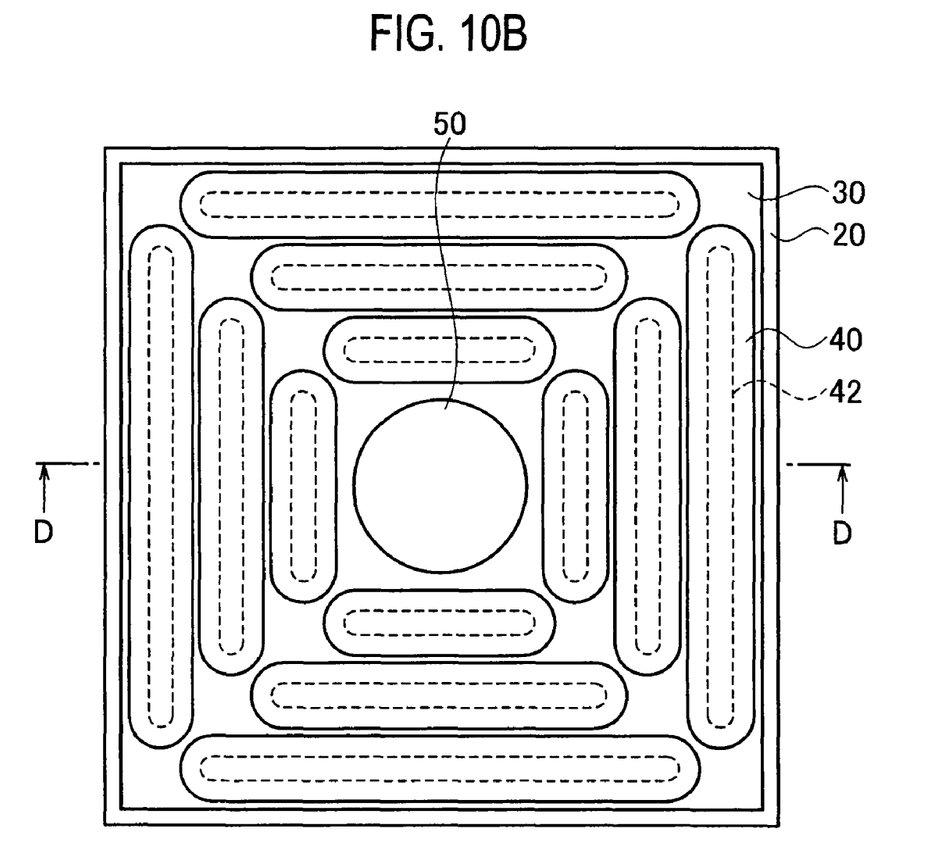
Figure 11A:
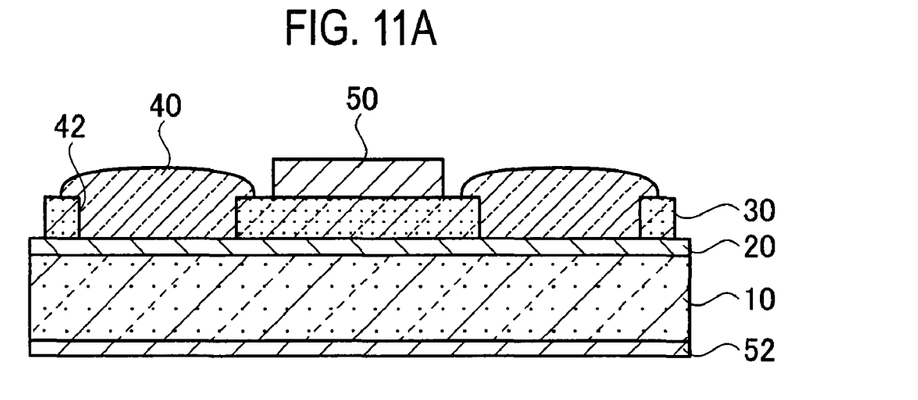
FIGS. 11A and 11B are schematic cross-sectional views of a semiconductor light-emitting element according to another embodiment of the present invention.
Figure 11B:
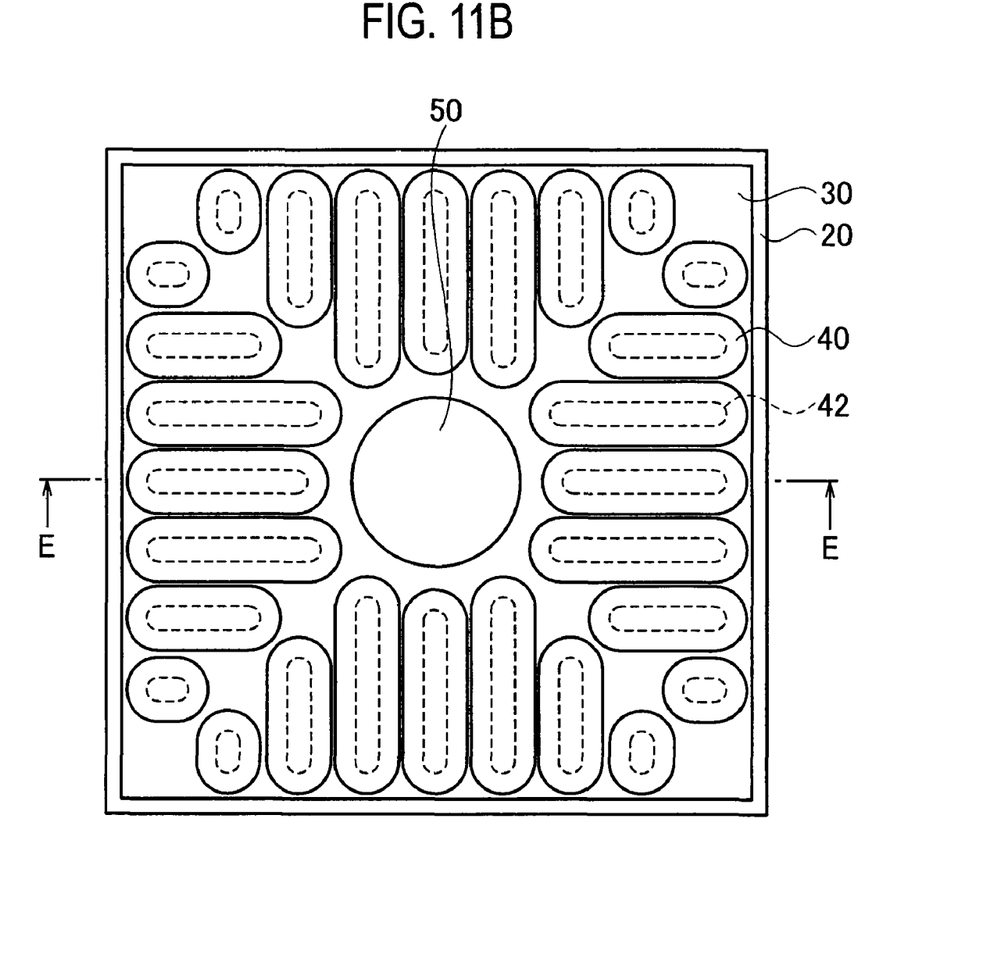
Figure 12A:
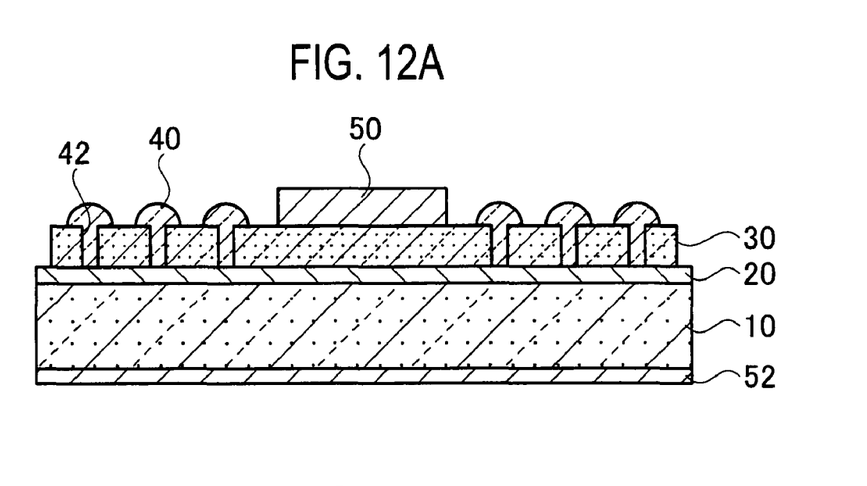
FIGS. 12A and 12B are schematic cross-sectional views of a semiconductor light-emitting element according to another embodiment of the present invention.
Figure 12B:
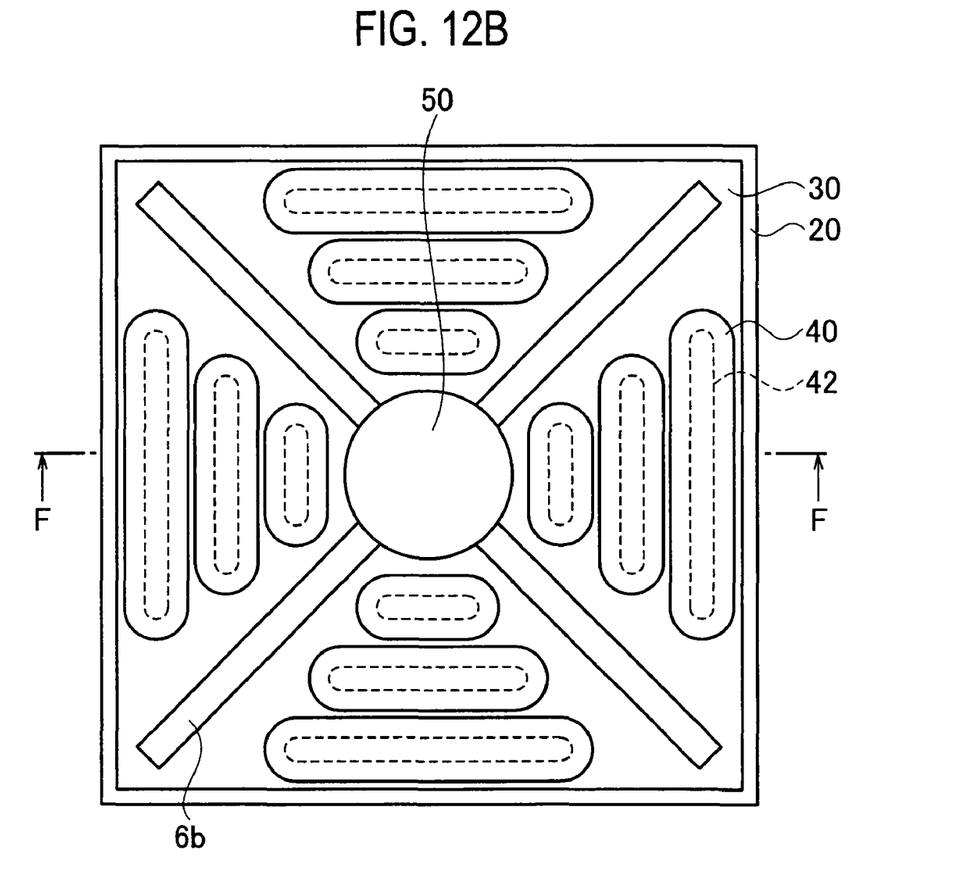

Moreover, only one type of the shape is illustrated for the semiconductor light-emitting elements according to the first to third embodiments; however, for example, a variety of shapes as shown in FIGS. 7A to 12B can be adopted for the semiconductor light-emitting elements. FIGS. 7A and 7B show a semiconductor light-emitting element, in which the lenses 40 of which number is the same as that of the holes as the groove portions 42 are provided so as to cover the grove portions 42 concerned. FIGS. 8A and 8B show a semiconductor light-emitting element, in which one groove portion 42 is provided in the light-emitting functional stacked body 30, and one lens 40 is provided so as to cover the groove portion 42. FIGS. 9A and 9B show a semiconductor light-emitting element, in which annular groove portions 42 are provided in the light-emitting functional stacked body 30, and ring-like lenses 40 are provided so as to cover the groove portions 42. FIGS. 10A and 10B and FIGS. 11A and 11B show semiconductor light-emitting elements, in each of which stripe-like groove portions 42 with a variety of lengths are provided in the light-emitting functional stacked body 30, and stripe-like lenses 40 are provided so as to cover the groove portions. FIGS. 12A and 12B show a semiconductor-light emitting element, in which an optically transparent conductive layer 6b is provided on the light extraction surface 30a of the light-emitting functional stacked body 30.

Furthermore, in the first to third embodiments, the manufacturing method of the semiconductor light-emitting element has been described as the manufacturing method using the lamination technique; however, the technique for use in the manufacturing method is not limited only to the lamination technique. For example, after the light-emitting functional stacked body 30 is grown on the support substrate 10, the groove portions 42 are formed in the light-emitting functional stacked body 30 by the RIE and the like, and the lenses 40 are provided on the groove portions 42, whereby the semiconductor light-emitting element according to an embodiment of the present invention can be manufactured. By manufacturing the semiconductor light-emitting element by this manufacturing method, the groove portions 42 with a desired depth can be formed in the light-emitting functional stacked body 30.

Furthermore, in the first to third embodiments, the enhancement of the extraction efficiency of the light from the light extraction surface 30a, which is an effect of the present invention, can be achieved even if the groove portions 42 are not formed.

Various modifications will become possible for those skilled in the art after receiving the teachings of the present disclosure without departing from the scope thereof.

What is claimed is:

1. A semiconductor light-emitting element comprising:
a light-emitting functional stacked body including a light-emitting region having a light-emitting function, and including a light extraction surface for extracting light emitted from the light-emitting region; and
an upward convex lens disposed on the light extraction surface, wherein
the light-emitting functional stacked body includes a groove portion formed from the light extraction surface to a position deeper than the light-emitting region, and the groove portion is included in the lens when viewed from the light extraction surface side, and
wherein plural irregularities are provided on an inner wall surface of the groove portion and on the light extraction surface.

* * * * *